United States Patent
Nitta

[11] Patent Number: 5,809,047
[45] Date of Patent: Sep. 15, 1998

[54] METHOD FOR DRIVING A WAVELENGTH CHANGEABLE LIGHT SOURCE APPARATUS, SUCH A WAVELENGTH CHANGEABLE LIGHT SOURCE APPARATUS AND AN OPTICAL COMMUNICATION SYSTEM USING THE SAME

[75] Inventor: Jun Nitta, Yamanishi, Japan

[73] Assignee: Canon Kabushiki Kaisha, Tokyo, Japan

[21] Appl. No.: 814,316

[22] Filed: Mar. 11, 1997

[30] Foreign Application Priority Data

Mar. 19, 1996 [JP] Japan ................................. 8-090364
Feb. 20, 1997 [JP] Japan ................................. 9-052359

[51] Int. Cl.[6] ........................................................ H01S 3/10
[52] U.S. Cl. ................................. 372/32; 372/18; 372/27
[58] Field of Search .................................. 372/18, 25, 26, 372/27, 20, 32, 29

[56] References Cited

U.S. PATENT DOCUMENTS

5,586,131 12/1996 Ono et al. ................................. 372/19
5,659,560 8/1997 Ouchi et al. .............................. 372/27

Primary Examiner—James W. Davie
Attorney, Agent, or Firm—Fitzpatrick, Cella, Harper & Scinto

[57] ABSTRACT

A light source apparatus includes a light source, a mode selecting unit, a light source control unit and a mode selection control unit. An oscillation mode of the light source is switchable between a first mode under a first stimulated condition and a second mode under a second stimulated condition, and an oscillation wavelength of the light source is changeable. The mode selecting unit selects between oscillation light in the first mode and oscillation light in the second mode emitted from the light source, and the mode selecting unit can change the mode to be selected between the first mode and the second mode. The light source control unit modulates the oscillation mode of the light source between the first mode and the second mode in accordance with a modulation signal and changes the oscillation wavelength of the light in the unselected mode to set this wavelength to a desired value, in response to an instruction from equipment connected to the light source apparatus, while repressing fluctuation of the oscillation wavelength of the light in the selected mode. The mode selection control unit controls the mode selecting unit to switch the mode to be selected by the mode selecting unit to the mode of the light whose oscillation wavelength has been set to the desired value by the light source control unit.

23 Claims, 11 Drawing Sheets

DRIVING SIGNAL

FIG.9B

LIGHT OUTPUT (TE-MODE $\lambda_{TE}$)

FIG.9C

LIGHT OUTPUT (TM-MODE $\lambda_{TM}$)

FIG.10A

DRIVING SIGNAL FOR λTE (TE-MODE)

FIG.10B

DRIVING SIGNAL FOR λTM (TM-MODE)

FIG.10C

OPTICAL SIGNAL

FIG.11

METHOD FOR DRIVING A WAVELENGTH CHANGEABLE LIGHT SOURCE APPARATUS, SUCH A WAVELENGTH CHANGEABLE LIGHT SOURCE APPARATUS AND AN OPTICAL COMMUNICATION SYSTEM USING THE SAME

BACKGROUND OF THE INVENTION

1. Field of the Invention

The present invention relates to a driving method, for driving a wavelength changeable light source apparatus, such as a wavelength tunable semiconductor optical device for use in wavelength division multiplexing (WDM) communications and the like. The present invention also relates to a wavelength changeable light source apparatus driven by that method, and to an optical communication method and an optical communication system using the wavelength changeable light source apparatus.

2. Related Background Art

Initially, an example of a driving method of a semiconductor laser will be described. The semiconductor laser is a polarization-mode switchable semiconductor laser in which the polarization mode of output light is changed between a transverse electric (TE) mode and a transverse magnetic (TM) mode depending on its stimulated condition. The driving method is used for the optical WDM communications and the like. This example is disclosed in a Japanese Patent Application filed on Aug. 30, 1995 by the assignee of this U.S. application (this Japanese application was subsequently abandoned by the filing of a Japanese internal-priority declared Patent Application, filed on Aug. 17, 1996, based on two Japanese Patent Applications including the mentioned abandoned Japanese application).

Figure 3:
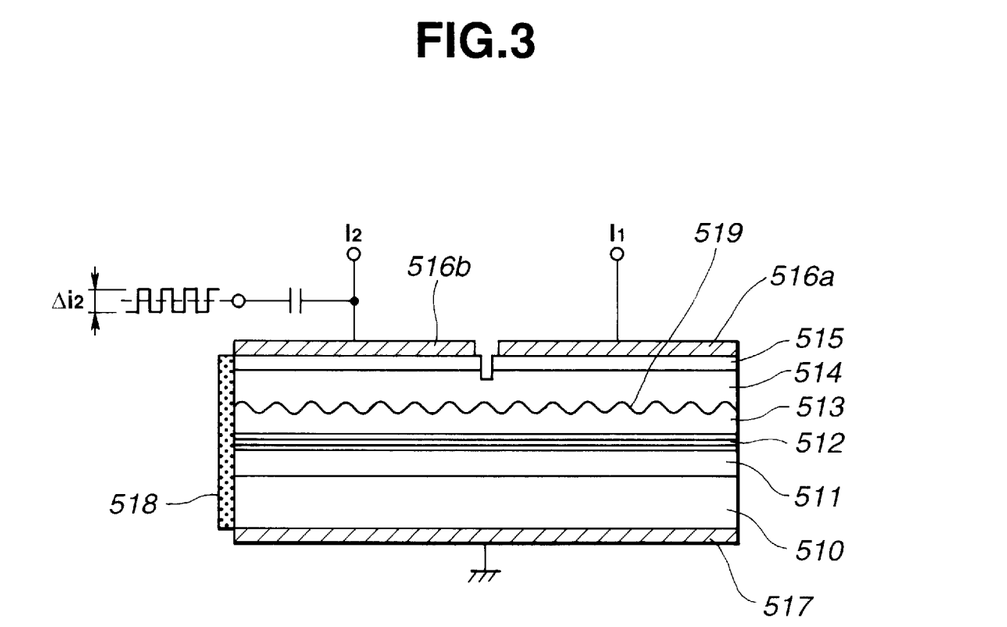
FIG. 3 is a cross-sectional view illustrating the structure of a semiconductor laser used in a first embodiment.
Figure 4:
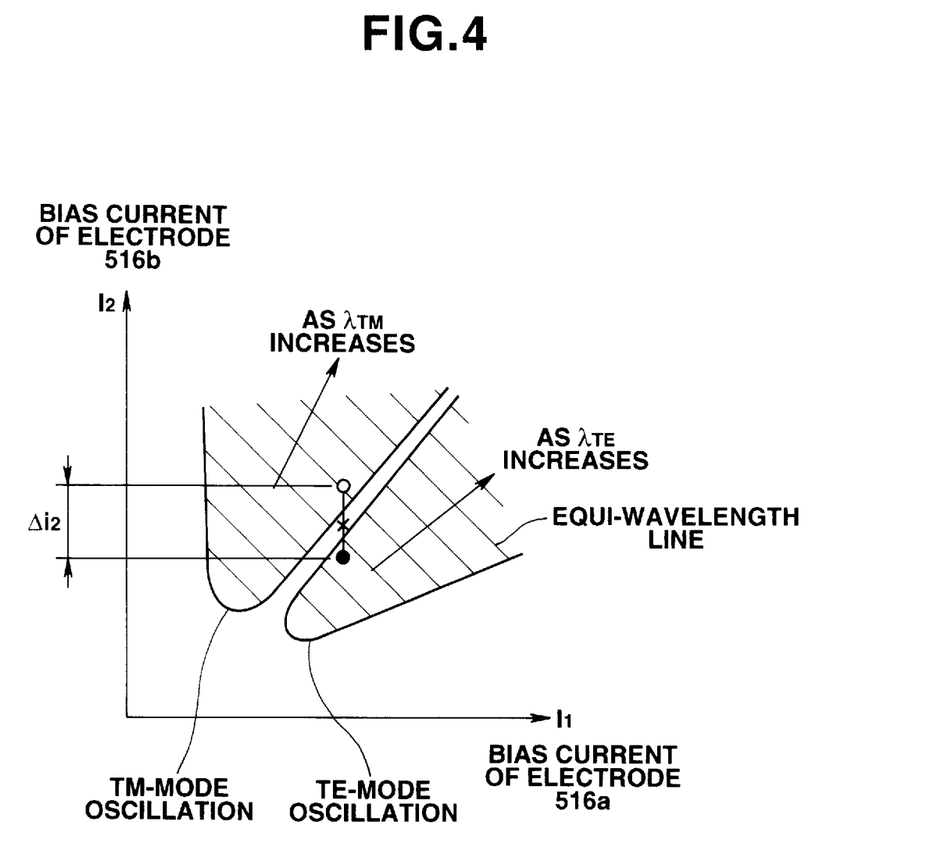
FIG. 4 is a graph illustrating characteristics of the semiconductor laser of FIG. 3.

An example of the semiconductor laser to be used in the above driving method is illustrated in FIG. 3. Its polarization-mode modulation characteristic and wavelength changing characteristic will be described with reference to FIG. 4. FIG. 4 is a graph representing a typical polarization-mode modulation characteristic of a two-electrode DFB laser diode (LD). The graph shows the relationship between bias currents $I_1$ and $I_2$ injected through the two electrodes and TE-mode and TM-mode oscillation zones. The two-electrode structure is asymmetric, and an antireflection (AR) coating is provided on one of the end facets as illustrated in FIG. 3, for example. The bias current $I_2$ is injected through an electrode 516b on the side of the AR coating 518, and the bias current $I1$ is injected through an electrode 516a on the side of a cleaved facet. In a region on the side of the AR coating 518, a high-injection state can be established by the modulation current, and a relatively large number of carriers are injected into an active layer 512 at that time. Then, an increase in gain is prominent on the shorter wavelength side, and the TM-mode oscillation becomes dominant. Here, the active layer 512 is assumed to be a quantum well active layer of InGaAs/InGaAsP as described below.

Figure 5:
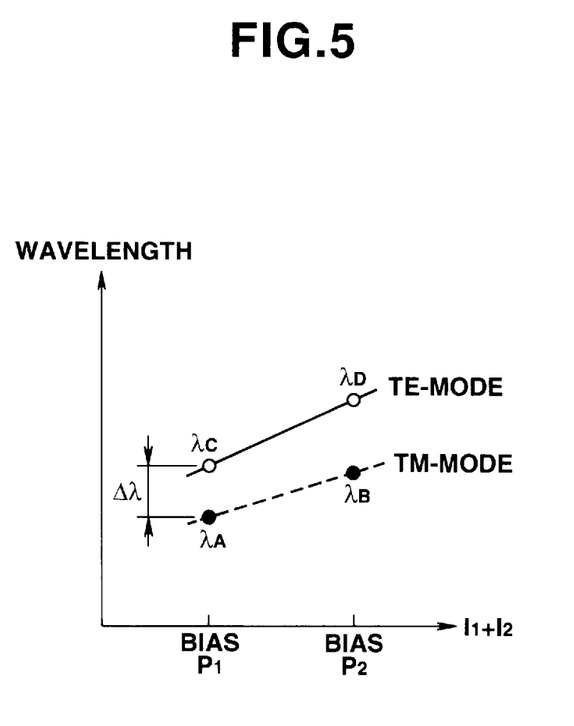
FIG. 5 is a graph illustrating the relationship between the bias current and the oscillation wavelength of the semiconductor laser of FIG. 3.

In FIG. 4, a boundary area between the two zones is an area in which the TE-mode oscillation competes with the TM-mode oscillation. Therefore, the oscillation polarization-mode switching can be effected by changing the balance between the two bias currents $I_1$ and $I_2$. For example, when the DC bias currents are injected as illustrated by a point x in the boundary area between the two zones and a square-wave current (its amplitude is $\Delta i_2$) is superimposed on the bias current injected through one or both of the two electrodes (in the illustrated case, injected through the electrode 516b), the polarization mode can be switched between the TE mode and the TM mode, as illustrated by blank and black circles in FIG. 4. The modulation current only has the amplitude $\Delta i_2$ of less than several milliamperes, and a modulated output can be obtained with a large extinction ratio by selecting one of the oscillation polarization modes. A difference $\Delta\lambda$ between wavelengths of the oscillated outputs in the two polarization modes is about 1 nm. In order to change the wavelength of output light, the DC bias current point indicated by the point x in FIG. 4 is shifted along the boundary area between the two polarization-mode zones. In this device, there is a tendency for wavelengths of outputs in both of the TE mode and the TM mode to shift toward the longer-wavelength side as the DC bias currents are increased. Therefore, when the above-discussed bias current point regarding $I_1+I_2$ is shifted and the bias current is modulated by superimposing the modulation current, two wavelength tunable ranges can be obtained corresponding to the two polarization modes, as illustrated in FIG. 5. The wavelength changeable or tunable range of the output can be expanded by utilizing those two wavelength tunable ranges in a combined manner.

Specifically, as shown in FIG. 5, when the bias current point is moved from point $P_1$ to point $P_2$, the output wavelength can be changed from $\lambda_A$ to $\lambda_B$ by selecting the TM mode. Then, the bias current point is returned to the point $P_1$ and the TE mode is selected by rotating 90 degrees an output polarization-mode switching element of a polarizer disposed in front of the semiconductor laser of FIG. 3. At this time, the bias current point is again moved from point $P_1$ to point $P_2$ to change the output wavelength from $\lambda_C$ to $\lambda_D$. By adopting this method, it is possible to expand the output wavelength range of an ordinary single fixed-polarization model, for example, by about twice. Thus, the wavelength multiplicity of optical communications can be effectively increased thereby.

The detailed structure and polarization-mode modulation characteristic of the DFB semiconductor laser will be described with reference to FIG. 3. In FIG. 3, reference numeral 510 designates an n-type InP substrate. Reference numeral 511 designates an n-type InGaAsP waveguide layer. Reference numeral 512 designates a quantum well active layer of InGaAs (well layer)/InGaAsP (barrier layer). Reference numeral 513 designates a p-type InGaAsP waveguide layer. Reference numeral 514 designates a p-type InP clad layer. Reference numeral 515 designates a $p^+$-InGaAs cap layer. Reference numerals 516a and 516b designate upper electrodes. Reference numeral 517 designates a lower electrode. Reference numeral 518 designates a $SiO_x$ layer deposited as the AR coating. Reference numeral 519 designates a diffraction grating.

The quantum well active layer 512 consists of at least an InGaAs well layer and at least an InGaAsP barrier layer, and has a gain spectrum specific thereto. On a longer wavelength side, a gain peak exists due to the transition between a ground quantum level of heavy holes (hh) in the valence band and a ground level of electrons in the conduction band, while on a slightly shorter wavelength side, a gain peak is present due to the transition between a next quantum level of light holes (lh) in the valence band and the ground level of electrons in the conduction band. The former transition, which occurs even at the time of a relatively-low current injection, has a gain for the TE mode, and the latter transition, which occurs even at the time of a relatively-high current injection, has gains for both of the TE mode and the TM mode. Thus, gain spectra with a polarization-mode dependency appear. In order to effect the polarization-mode modulation, the Bragg wavelength is selected in accordance with the gain peak of the TM mode such that the oscillation in the TM mode having a lower gain can be assisted. According thereto, a pitch of the diffraction grating 519 is determined. There appears a difference $\Delta \lambda$ between the Bragg wavelengths of the TE mode and the TM mode due to a difference between propagation constants for those two modes of the waveguide of the active layer.

As described above, the gain spectra for the polarization modes are varied by changing the injected-current balance $(I_1, I_2)$, and at the time of a high-injection state, the gain for the TM mode largely increases, compared with the gain for the TE mode. Thus, the oscillation competition occurs between the TE mode and the TM mode, and the oscillation can be switched between those polarization modes. The oscillation wavelength difference $\Delta \lambda$ between the TE mode and the TM mode is determined by the difference between the propagation constants of those polarization modes. When a common quantum well structure is used, that difference is about 1 nm to 2 nm.

The oscillation wavelength difference can be designed in various manners, such as by forming diffraction gratings having different pitches in the cavity direction, by forming different waveguide structures in the cavity direction, by arranging different quantum well active layers in the cavity direction and by introducing a strained superlattice into the quantum well structure. The oscillation wavelength difference between the two polarization modes at the time of the polarization-mode modulation, which is necessary and sufficient to make use of the above feature of the range combining system, can be seen to be about the wavelength-tunable range for one of the two polarization modes such that the wavelength-tunable ranges of the two polarization modes will not largely overlap with each other, as is known from the operation example of FIG. 5.

Thus, in the semiconductor laser having the characteristic of FIG. 4, light in the TE mode or the TM mode can be obtained by controlling currents injected through the two electrodes. For example, by modulating the current injected through one of the two electrodes, the polarization mode of the output light is changed in accordance with the modulation signal and an optical signal can be obtained. When light in one polarization mode is selected from the polarization-mode switching optical signal by using a polarizer or the like, an intensity-modulated optical signal can be obtained corresponding to the modulation signal. In such a semiconductor laser, the bias current point is changed from the point $P_1$ to the point $P_2$ as illustrated in FIG. 5 to change the oscillation wavelength. Thus, when light in the TM mode is selected, the wavelength is changed from $\lambda_A$ to $\lambda_B$. In this device, when the bias current point is returned from the point $P_2$ to the point $P_1$ and the polarizer is controlled to select the TE mode, the oscillation wavelength is changed from $\lambda_C$ to $\lambda_D$ as the bias current point is again changed from the point $P_1$ to the point $P_2$.

In the above example, however, since the wavelength of light is selected by the polarizer for use, is itself also changed (the wavelength of unused light is also changed at the same time) when the light in use is to be changed, time is required to stabilize the wavelength of light in use after the wavelength-changing operation is started, similar to a conventional tunable semiconductor laser. That is, where the amount of injected current is varied to change the oscillation wavelength, if the change of the amount of the injected current is relatively large, a state, in which temperature and carrier distributions are uneven in the cavity, temporarily occurs. Hence, the oscillation wavelength and light output in use fluctuate until a stationary state is recovered, and thus it takes time to recover the stabilized state.

SUMMARY OF THE INVENTION

It is an object of the present invention to provide a driving method of driving a wavelength changeable light source apparatus, such as a wavelength tunable semiconductor optical device for use in wavelength division multiplexing (WDM) communications and the like, for eliminating wasted time after the oscillation wavelength begins to be changed and until this wavelength is stabilized when the wavelength in use is to be changed at the time of communications and the like, a wavelength changeable light source apparatus, an optical communication system using the wavelength changeable light source apparatus.

The invention is directed to an art in which, during a time when communication or the like is performed using light of a first wavelength (at this time, the oscillation mode of a light source is a first mode under a first stimulated condition, and the mode is defined by a wavelength (a so-called longitudinal mode), a polarization state, or both the wavelength and the polarization state), an unused second wavelength (at this time, the oscillation mode of the light source is a second mode under a second stimulated condition) is changed (for example, gradually changed) to be set to a desired wavelength while fluctuation of the first wavelength in the first mode in use is repressed, and then the mode to be selected by a mode selecting unit is changed from the first mode to the second mode, after the communication or the like using the light of the first wavelength is stopped, to start the communication or the like using the light of the changed second wavelength.

According to the above art, it is possible to perform the communication or the like using the first wavelength even during a period after the second wavelength begins to be changed and until the changed second wavelength is stabilized, so that the communication or the like need not be stopped even during the changing process of the wavelength. Thus, this changing process of the wavelength will not be a wasteful time.

According to one aspect of the present invention, there is provided a light source apparatus including a light source, a mode selecting unit, a light source control unit and a mode selection control unit. An oscillation mode of the light source is switchable between a first mode under a first stimulated condition and a second mode under a second stimulated condition, and an oscillation wavelength of the light source is changeable. The mode selecting unit selects one of oscillation light in the first mode and oscillation light in the second mode emitted from the light source, and the mode selecting unit can change the mode of the light source to be selected between the first mode and the second mode. The light source control unit modulates the oscillation mode of the light source between the first mode and the second mode in accordance with a modulation signal and changes the oscillation wavelength of the light in the unselected mode to set this wavelength to a desired value, in response to an instruction from a piece of equipment connected to the light source apparatus, while repressing fluctuation of the oscillation wavelength of the light in the selected mode. The mode selection control unit controls the mode selecting unit to switch the mode to be selected by the mode selecting unit to the mode of the light whose oscillation wavelength has been set to the desired value by the light source control unit.

More specifically, the following constructions are possible:

The first mode and the second mode are respectively two linear polarization modes which are perpendicular to each other where the light source is an oscillation polarization-mode switchable semiconductor laser, for example. In this case, the mode selecting unit typically has a polarization-mode dependency, one of the oscillation light in the first mode and the oscillation light in the second mode is selected due to the polarization-mode dependency, and the mode to be selected can be switched by changing the polarization-mode dependency.

Further, the oscillation wavelength in the first mode is always different from the oscillation wavelength in the second mode (in this case, the polarization state may be the same). In this case, the mode selecting unit typically has a wavelength dependency, one of the oscillation light in the first mode and the oscillation light in the second mode is selected due to the wavelength dependency, and the mode to be selected can be changed by changing a wavelength or a wavelength range to be selected. In this case, the light source is an optical frequency modulating (FSK modulation) laser, and the mode selecting unit is a bandpass filter, a sharp cut filter or the like, for example.

Further, in the above driving method, communication is performed by using the oscillation light in the mode selected by the mode selecting unit, and the communication is continued by using the oscillation light in the selected mode even during a period in which the oscillation wavelength of the light in the unselected mode is changed to be set to the desired value.

Further, in the above driving method, the changing step is performed by a step in which, when the light source is oscillated in the first mode by a first control amount applied thereto and oscillated in the second mode by a second control amount applied thereto, the control amount for oscillating the light source in the unselected mode is controlled to change the oscillation wavelength of the light in the unselected mode, while the control amount for oscillating the light source in the selected mode is controlled such that fluctuation or variation of the oscillation wavelength of the light in the selected mode is being repressed.

Further, in the above driving method, the control of the control amount for oscillating the light source in the unselected mode is gradually performed in a plurality of divided steps.

Further, in the above driving method, the modulation signal for modulating the light source is inverted when the mode selecting unit switches the mode to be selected.

According to another aspect of the present invention, there is provided a light source apparatus including the following elements:

- a light source, whose oscillation mode is switchable between a first mode under a first stimulated condition and a second mode under a second stimulated condition and whose oscillation wavelength is changeable;
- a mode selecting unit for selecting between oscillation light in the first mode and oscillation light in the second mode emitted from the light source, which can change the mode to be selected between the first mode and the second mode;
- a light source control unit for modulating the oscillation mode of the light source between the first mode and the second mode in accordance with a modulation signal and changing the oscillation wavelength of the light in the unselected mode to set this wavelength to a desired value, in response to an instruction from an equipment connected to the light source apparatus, while repressing fluctuation of the oscillation wavelength of the light in the selected mode; and
- a mode selection control unit for controlling the mode selecting unit to switch the mode to be selected by the mode selecting unit to the mode of the light whose oscillation wavelength has been set to the desired value by the light source control unit.

In the above light source apparatus, the first mode and the second mode may be respectively two linear polarization modes which are perpendicular to each other, and the mode selecting unit may be or comprise a polarization selecting unit which has a polarization-mode dependency.

Further, the oscillation wavelength in the first mode may be always different from the oscillation wavelength in the second mode, and the mode selecting unit may be or comprise a wavelength selecting unit using a bandpass filter which can change a wavelength or a wavelength range to be selected thereby, or a wavelength selecting unit whose state can be changed between states in which wavelengths above and below a predetermined wavelength (the predetermined wavelength is a wavelength between wavelengths $\lambda_B$ and $\lambda_C$ indicated in FIG. 5, for example) are respectively selected.

According to still another aspect of the present invention, there is provided an optical communication system for communicating over a light transmission medium that transmits signals from a transmitter side to a receiver side, in which a transmitter includes the above-discussed light source apparatus of this invention.

These objects, features and advantages and others will be more readily understood in connection with the following detailed description of the preferred embodiments in conjunction with the drawings.

DESCRIPTION OF THE PREFERRED EMBODIMENT

[First Embodiment]

Figure 1:
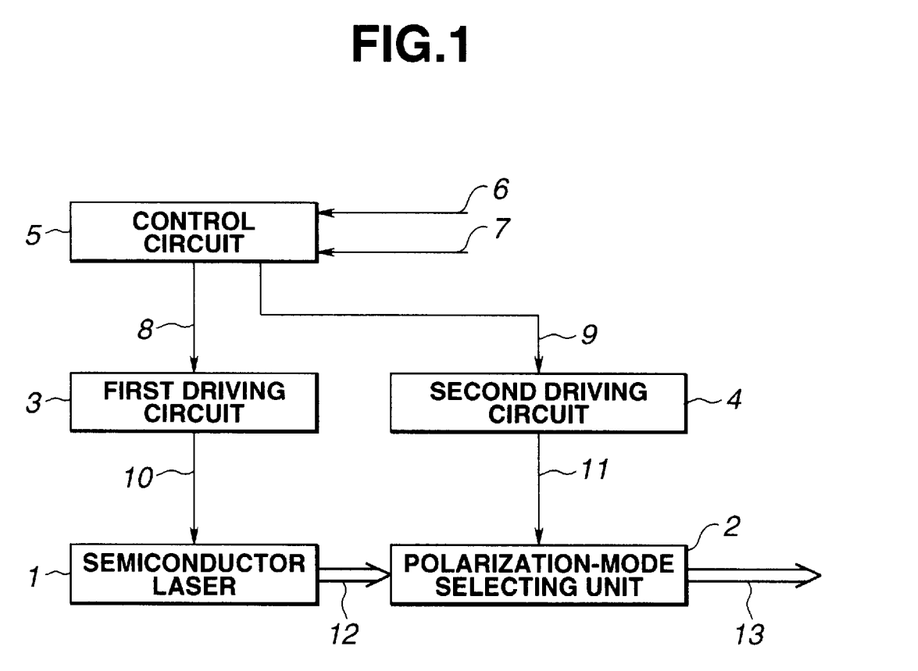
FIG. 1 is a block diagram illustrating the structure of a light source apparatus of a first embodiment according to the present invention.

FIG. 1 illustrates the schematic structure of a first embodiment of the present invention. In FIG. 1, reference numeral 1 designates a semiconductor laser whose polarization mode of output light can be changed between a transverse electric (TE) mode (light having an electric field vector only in a direction parallel to a pn junction) and a transverse magnetic (TM) mode (light having a magnetic field vector only in a direction parallel to a pn junction) depending on its stimulated condition and whose oscillation wavelength can be changed. Reference numeral 2 designates a polarization-mode selecting unit for selecting light in one of the TE mode and the TM mode radiated from the semiconductor laser 1. Reference numeral 3 designates a first driving circuit for driving the semiconductor laser 1. Reference numeral 4 designates a second driving circuit for driving the polarization-mode selecting unit 2. Reference numeral 5 designates a control circuit. Reference numeral 6 designates a wavelength selection signal. Reference numeral 7 designates a signal to be transmitted. Reference numeral 8 designates a first control signal. Reference numeral 9 designates a second control circuit. Reference numeral 10 designates a first driving signal. Reference numeral 11 designates a second driving signal. Reference numeral 12 designates a light output from the semiconductor laser 1. Reference numeral 13 designates an optical signal which is created from the light output 12 by selecting one of the two polarization modes using the polarization-mode selecting unit 2.

Figure 2:
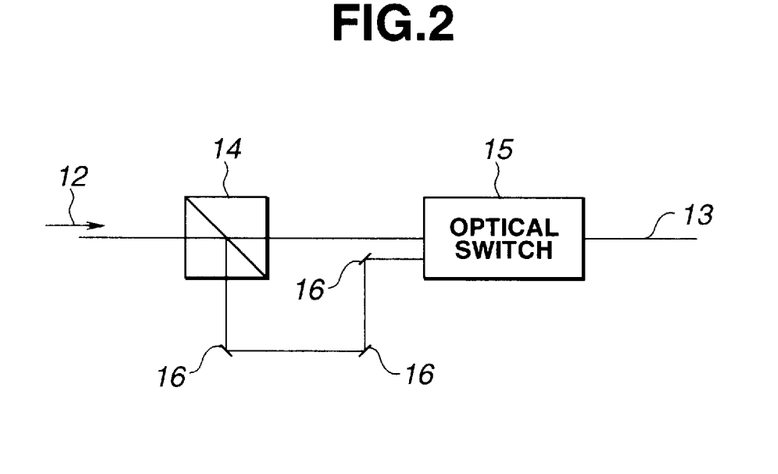
FIG. 2 is a block diagram illustrating the structure of a polarization-mode selecting unit of a mode selecting unit used in the first embodiment.

FIG. 2 illustrates a specific structure of the polarization-mode selecting unit 2. In FIG. 2, reference numeral 14 designates a polarization beam splitter. Reference numeral 15 designates an optical switch for selecting one of two light inputs from the polarization beam splitter 14. Reference numeral 16 designates a mirror.

In the structure of FIG. 2, the light output 12 (which is light in the TE mode or light in the TM mode depending on the stimulated condition of the semiconductor laser 1) is divided into two paths of light in the TE mode and the TM mode, one of the two divided portions of the light output 12 is selected by the optical switch 15, and light in the TE mode or the TM mode of the light output 12 is made into the optical signal 13. As the optical switch 15, a conventional element can be used, such as a mechanical type in which a prism, a mirror, an optical fiber itself, or the like is movable, and an element of lithium niobate (LiNbO$_3$) or the like in which the electro-optic effect, magneto-optic effect, thermo-optic effect or the like is employed. The second driving signal 11 serves as a signal for mechanically moving the prism or the like, or for supplying an electric power to the electrode of a phase modulating type optical switch, a directional coupler type optical switch or the like. FIG. 3 illustrates a specific example of the semiconductor laser 1.

Figure 6:
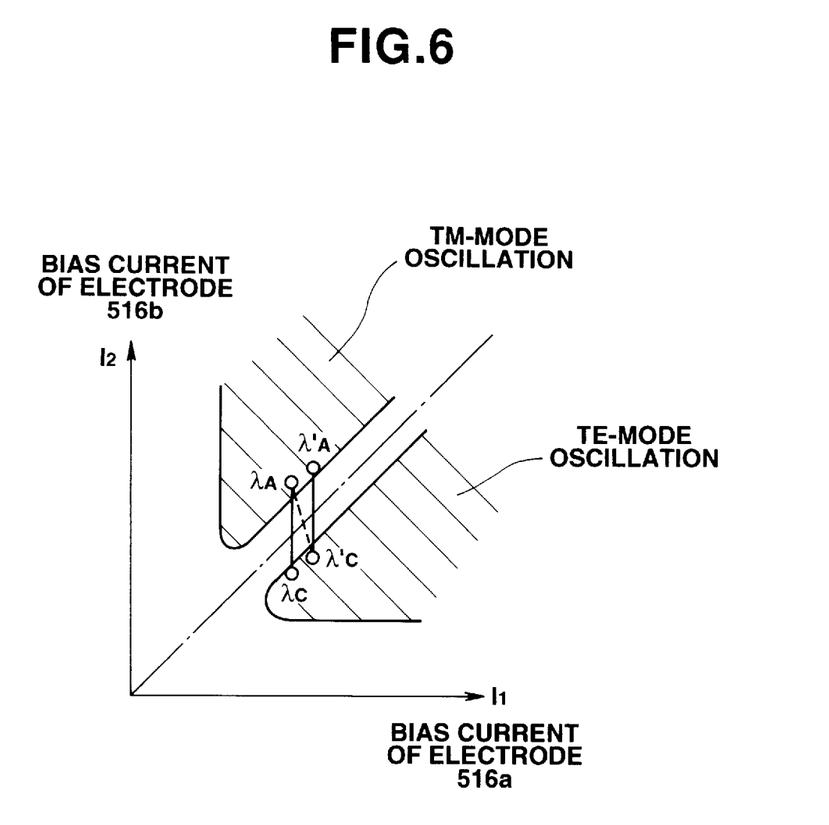
FIG. 6 is a graph illustrating the operation of the light source apparatus according to the present invention.

The operation of this embodiment will be described. When the control circuit 5 receives the wavelength selecting signal 6 (for example, for instructing the output of light at a wavelength $\lambda_A$), the control circuit 5 selects an operation point of the semiconductor laser 1, at which the laser 1 can output light of a corresponding wavelength (for example, the wavelength $\lambda_A$), and supplies the first and second control signals 8 and 9 to the first and second driving circuits 3 and 4. Upon receiving the first control signal 8, the first driving circuit 3 appropriately sets the amounts of current or bias current such that semiconductor laser 1 can output light of $\lambda_A$ in the TM mode and light of $\lambda_C$ in the TE mode as illustrated in FIG. 6. Upon receiving the second control signal 9, the second driving circuit 4 supplies the second driving signal 11 to the polarization-mode selecting unit 2 such that the polarization-mode selecting unit 2 selects the TM-mode component (i.e., light at the wavelength $\lambda_A$) from the light output 12 of the semiconductor laser 1 and makes the TM-mode component into the optical signal 13. Under such a condition, the semiconductor laser 1 is driven in accordance with the signal 7 to obtain the optical signal 13 corresponding to the signal 7.

When the wavelength of the output light in use (in this case, the TM-mode component) is to be changed, the following operation is executed. When the wavelength selecting signal 6 requires that the light signal 13 should be output at another wavelength (for example, a wavelength $\lambda_C'$), the control circuit 5 changes the driving condition of the first driving circuit 3. In other words, the driving condition is varied such that the modulation between the wavelength $\lambda_A$ (the TM mode) and the wavelength $\lambda_C$ (the TE mode) is changed to the modulation between the wavelength $\lambda_A$ (the TM mode) and the wavelength $\lambda_C'$ (the TE mode), as illustrated in FIG. 6. This change of operation means that the initial state, in which the bias current $I_1$ is fixed and the current $I_2$ is modulated, is changed to the state, in which both of the currents $I_1$ and $I_2$ are modulated.

The manner of changing the current at this time is as follows, for example. The current is changed such that the wavelength of the unused light is changed from $\lambda_C$ to $\lambda_C'$ step by step but not at a step (if a difference between $\lambda_C$ and $\lambda_C'$ is sufficiently small, this wavelength may be changed at a step). For example, the current $I_1$, which contributes to establishment of the wavelength $\lambda_C$ (the TE mode) and is fixed up to now, is changed step by step such that a non-stationary or unstable condition would not appear concurrently. At this time, if the wavelength $\lambda_A$ (the wavelength in use) gradually changes due to the change Ifor changing the wavelength $\lambda_C$ (the unused wavelength), the wavelength $\lambda_A$ needs to be maintained at a constant value by controlling the modulation current $I_2$, for example. Where the unused wavelength is only changed to a desired wavelength while fluctuation of the wavelength in use is being repressed by gradually changing at least one of the currents $I_1$ and $I_2$, which both contribute to establishment of the wavelength $\lambda_C$ (the unused light in the TE mode), step by step, the current is changed according to such a process. Also, in this case, if the wavelength $\lambda_A$ (the wavelength in use) is likely to fluctuate, the currents $I_1$ and $I_2$, which both contribute to establishment of the wavelength $\lambda_A$ (the TE mode), are also controlled appropriately.

In such a state, after the changed wavelength $\lambda_C'$ (the unused wavelength) has reached a stable state, light at the wavelength $\lambda_C'$, which has been unused light up to now, is converted into the optical signal 13 by changing the polarization mode, which is selected by the polarization-mode selecting unit 2, from the TM mode to the TE mode. During such a wavelength changing process, communication is performed without a pause by using the light of the wavelength $\lambda_A$.

Whether the output wavelength has been really changed to the desired wavelength, is confirmed as follows. (1) After the injected current (the bias current and the modulation current) has been properly set on the basis of the beforehand-measured relationship between the injected current, the oscillation wavelength and the oscillation polarization mode, a sufficient time is taken for waiting. (2) A wavelength detecting unit is built in the apparatus to monitor the oscillation wavelength.

Afterward, the above-discussed procedure, in which only the wavelength of the polarization mode not selected by the polarization-mode selecting unit 2 for use is changed, will be repeated. Although the wavelength is sequentially changed, say from $\lambda_A$ to $\lambda_C'$ (which are relatively close to each other), in FIG. 6, the wavelength can be shifted to any wavelength provided only that this wavelength can be output in the polarization mode which is not in use for optical communication at each time.

Figure 7:
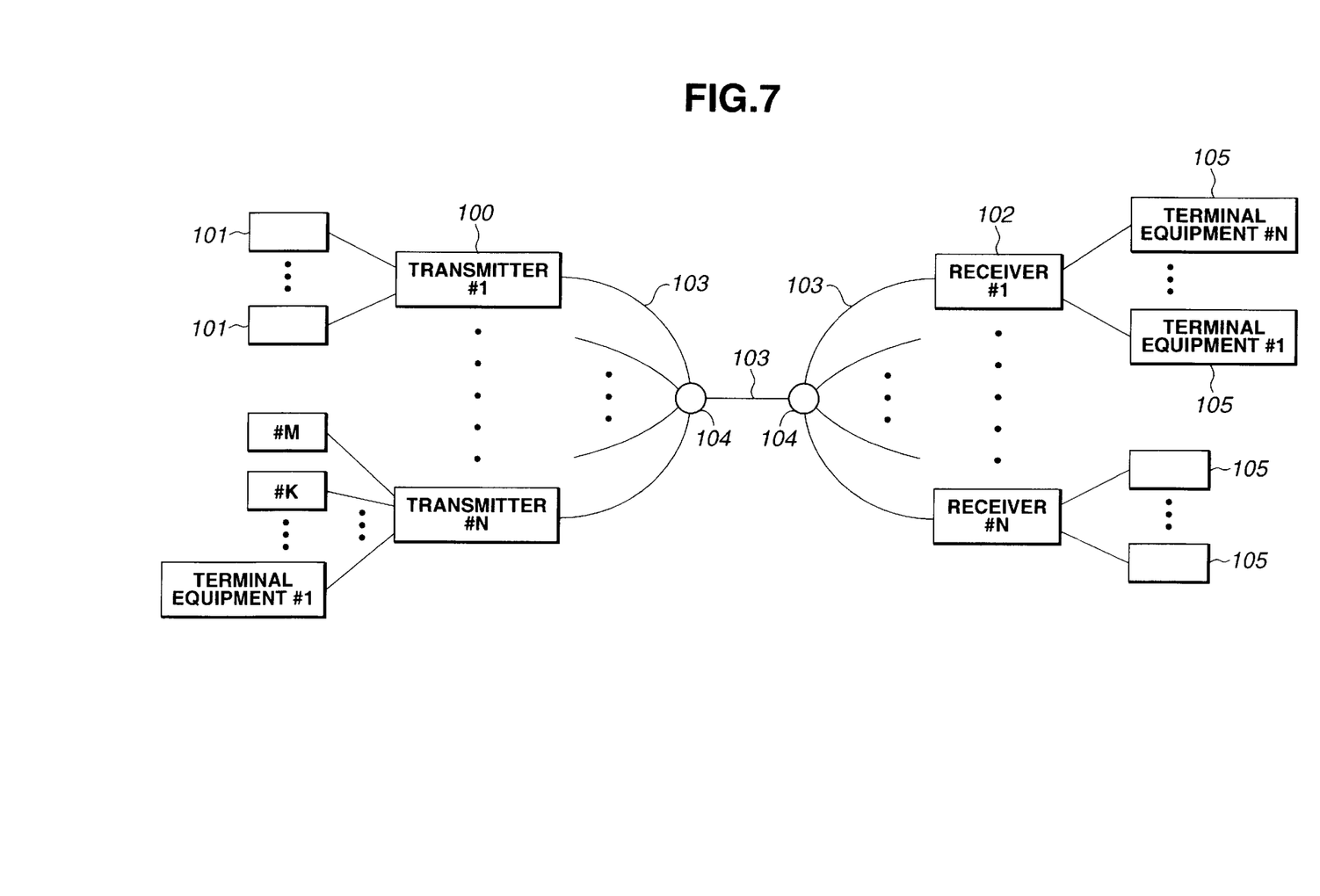
FIG. 7 is a block diagram illustrating the structure of a communication system using the light source apparatus of the present invention.

An example of optical communication systems using the above-discussed device will be described. FIG. 7 illustrates an optical communication system. In FIG. 7, reference numeral 100 designates a light transmitter whose internal structure is as illustrated in FIG. 1 (normally, a plurality of N light transmitters are provided as shown). Reference numeral 101 designates terminal equipment connected to the light transmitter 100. Reference numeral 102 designates a light receiver (again, a plurality of such light receivers are normally present), reference numeral 103 designates optical fibers, reference numeral 104 designates star couplers and reference numeral 105 designates terminal equipment connected to the light receiver 102.

Figure 8:
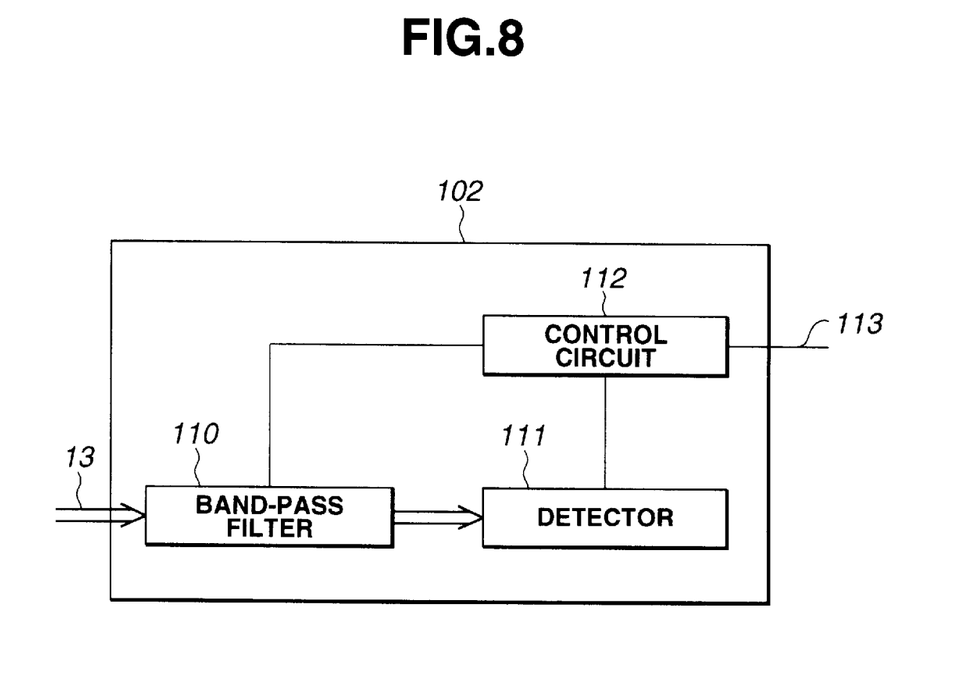
FIG. 8 is a block diagram illustrating the structure of a receiver used in the communication system of FIG. 7.

FIG. 8 illustrates the schematic structure of the light receiver 102. In FIG. 8, reference numeral 13 designates the optical signal transmitted from the light transmitter 100, reference numeral 110 designates an optical bandpass filter, reference numeral 111 designates a light detector, reference numeral 112 designates a control circuit and reference numeral 113 designates a signal created by converting the optical signal 13 into an electric signal.

This optical communication system is briefly illustrated to aid in explaining the manner of communication. In this communication, light having a wavelength in the range illustrated in FIG. 5 can be used. A case where the light receiver 102 has the fixed optical bandpass filter 110 (the wavelength transmitted therethrough is fixed) will be described first.

For example, a case where terminal equipment #1 (101) connected to light transmitter #N (100) transmits a signal to terminal equipment #1 (105) connected to light receiver #1 (102), will be described. The transmitting terminal equipment #1 (101) notifies light transmitter #N (100) of an addressed destination to which the signal is to be transmitted. The light transmitter #N (100) examines whether the wavelength of light in the unused polarization mode can be changed to a wavelength of the addressed destination (the relationship between a usable wavelength range, the polarization mode and the amount of current needed to create this state is obtained beforehand). As a result of this inspection, when the wavelength of the addressed destination is a usable wavelength, the wavelength in the unused polarization mode is changed as discussed above. Immediately after the changed wavelength is stabilized and communication using light in another polarization mode has been finished, the polarization mode to be used is switched by the polarization-mode selecting means 2, and communication is started again using the light in the newly-selected polarization mode.

Here, there is a need to modify the driving method for driving the semiconductor laser 1 depending on the polarization mode in use (the TE mode or the TM mode). For example, the following method can be employed.

Figure 9A:
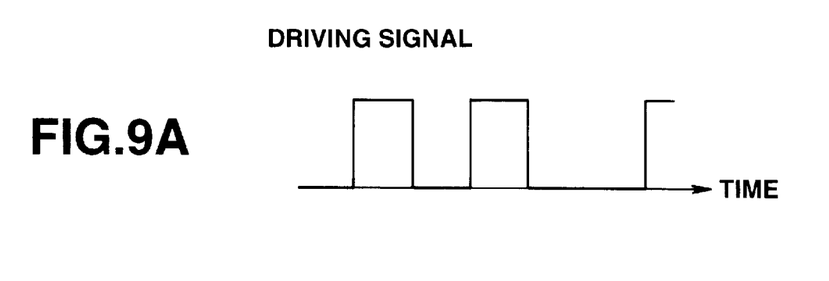
FIGS. 9A, 9B and 9C are respectively graphs illustrating the operation and characteristics of the semiconductor laser of FIG. 1.
Figure 9B:
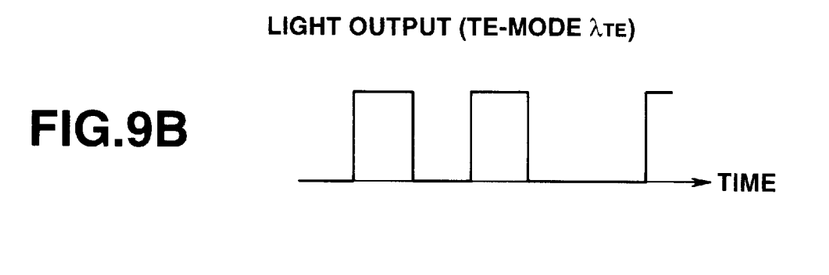
Figure 9C:
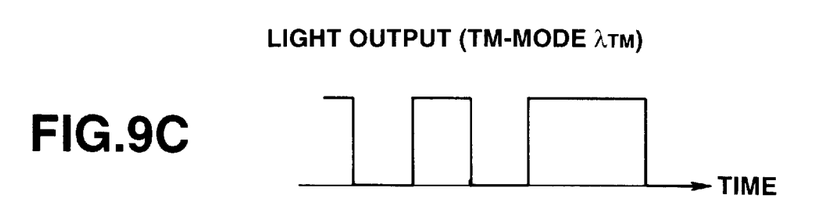
Figure 10A:
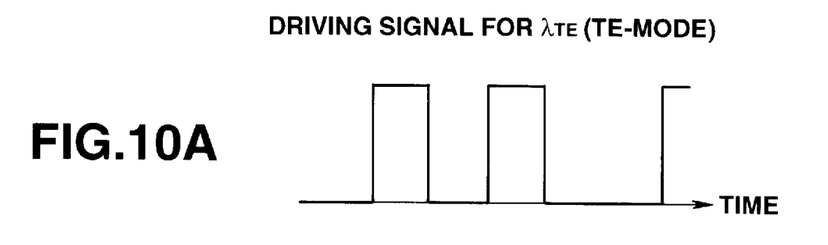
FIGS. 10A, 10B and 10C are respectively graphs illustrating the operation and modified driving method of the semiconductor laser of FIG. 1.
Figure 10B:
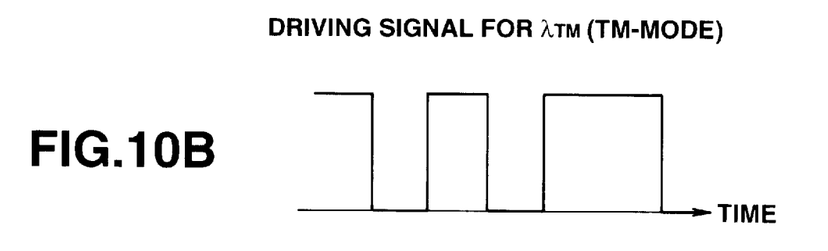

FIGS. 9B and 9C illustrate light outputs at the time when the semiconductor laser 1 is driven. FIG. 9A illustrates a signal (for example, the above-discussed modulation current) for driving the semiconductor laser 1. FIGS. 9B and 9C illustrate the light outputs in the respective polarization modes of light from the semiconductor laser 1. In this case, the light output in the TE mode (FIG. 9B) is in phase with the driving signal of FIG. 9A (the same phase), while the light output in the TM mode (FIG. 9C) is out of phase with the driving signal of FIG. 9A (the inverted phase). Therefore, appropriate steps are taken such that waves of the light outputs in the TE mode and the TM mode become equal to each other. FIGS. 10A and 10B illustrate driving signals for equalizing the light output waves in the TE mode and the TM mode.

Figure 10C:
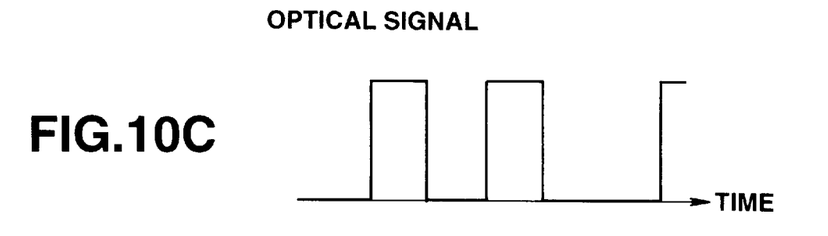

FIG. 10C shows the optical signal 13 obtained by selecting the polarization mode of the light output 12 from the semiconductor laser 1 driven according to the signal of FIG. 10A or 10B by the polarization-mode selecting means 2. As illustrated in FIGS. 10A and 10B, the driving signal for the TE mode is complementary to the driving signal for the TM mode. According to such a driving method using the signals of Figs. 10A and 10B, the same signal (FIG. 10C) can be obtained as the optical signal 13 due to the characteristics of the semiconductor laser 1 used herein. That is, when the driving is performed using the signal of FIG. 10A, the optical signal 13 is created by selecting the TE-mode component of the optical output 12 by the polarization-mode selecting means 2, and when the driving is performed using the signal of FIG. 10B, the optical signal 13 is created by selecting the TM-mode component of the optical output 12 by the polarization-mode selecting means 2.

[Second Embodiment]

Figure 11:
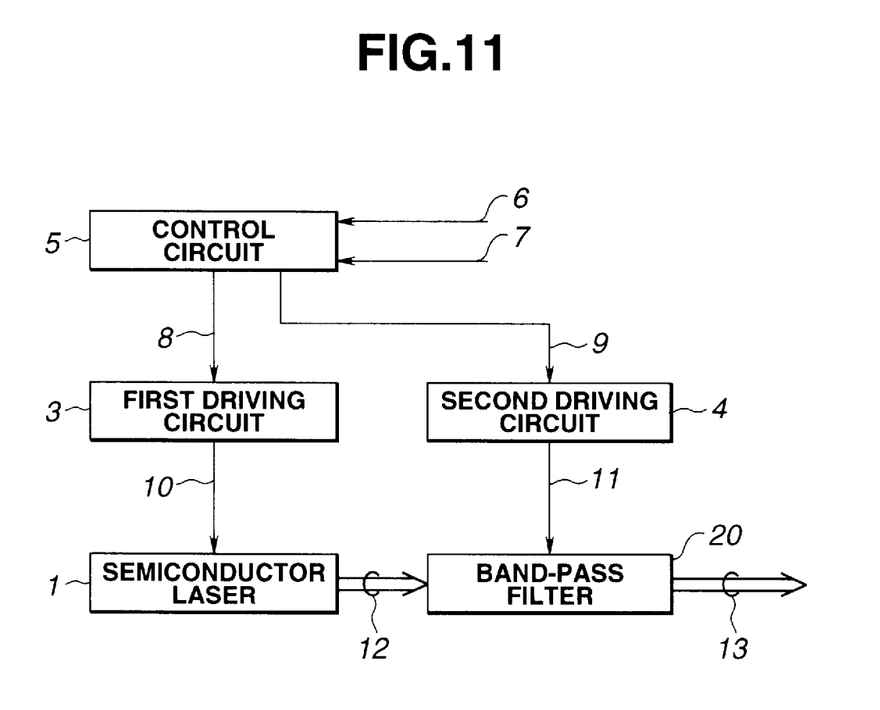
FIG. 11 is a block diagram illustrating the structure of a light source apparatus of a second embodiment according to the present invention.

A second embodiment will be described with reference to FIG. 11. In FIG. 11, the same elements as those in FIG. 1 are designated by the same reference numerals. Reference numeral 20 designates an optical bandpass filter. The optical bandpass filter 20 has a structure whose selection or transmission wavelength or wavelength range is changeable by control from outside.

In this embodiment, the optical bandpass filter 20 is used in place of the polarization-mode selecting means 2 of FIG. 1. The relationship between the bias current of the semiconductor laser 1 and the oscillation wavelength is as illustrated in FIG. 5. Under a certain operation condition, light of a first wavelength (for example, $\lambda_A$) in the TM mode and light of a second wavelength (for example, $\lambda_C'$) in the TE mode are output. While light of the wavelength $\lambda_A$ in the TM mode is selected by the optical bandpass filter 20, light of another wavelength $\lambda_C$ in the TE mode can be changed. Here, the difference between $\lambda_A$ and $\lambda_C$ needs to be larger than the transmission wavelength width of the optical bandpass filter 20. The operation is otherwise the same as that of the first embodiment.

Further, when the laser is one having a Fabry-Perot type cavity or the like, there is a case where a plurality of wavelengths are concurrently radiated (multi-mode oscillation) under a condition of a certain bias value. In such a case, the selection wavelength width needs to be narrower than the wavelength interval between the two concurrently-radiated wavelengths such that a single mode of the multi-mode oscillation can be selected.

Further, where the laser is one which has a single mode selection structure, such as a DFB structure and a DBR structure, and is not oscillated in a multi-mode manner, and where influence of another wavelength can be ignored for the reason that the wavelength interval in the multi-mode oscillation is sufficiently wide or for other reasons, a sharp cut filter, which performs a wavelength selection in a range above or below a predetermined wavelength, can be used in place of the bandpass filter. In this case, the switching of the selected mode can be performed by switching the selection of the wavelength range between the ranges above and below the predetermined wavelength by the sharp cut filter.

Except as otherwise disclosed herein, the various components shown in outline or block form in any of the FIGS. 1-11 are individually well known in the arts relating to optical semiconductor devices, driving methods therefor and optical communication, and their internal construction and operation are accordingly not described herein.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. A method for driving a light source apparatus which includes a light source, whose oscillation mode is switchable between a first mode under a first stimulated condition and a second mode under a second stimulated condition and whose oscillation wavelength is changeable, and mode selecting means which selects between oscillation light in the first mode and oscillation light in the second mode emitted from the light source and which can change the mode to be selected between the first mode and the second mode, said method comprising the steps of:

modulating the oscillation mode of the light source between the first mode and the second mode in accordance with a modulation signal;

selecting one of the oscillation light in the first mode and oscillation light in the second mode using the mode selecting means and outputting the selected one from the mode selecting means;

changing the oscillation wavelength of the light in the unselected mode and setting this wavelength to a desired value, in response to an instruction from equipment connected to the light source apparatus, while repressing fluctuation of the oscillation wavelength of the light in the selected mode; and switching the mode to be selected by the mode selecting means to the mode of the light whose oscillation wavelength has been set to the desired value in said changing step.

2. A method for driving a light source apparatus according to claim 1, wherein the light source comprises a laser device.

3. A method for driving a light source apparatus according to claim 1, wherein the first mode and the second mode are respectively two linear polarization modes which are perpendicular to each other.

4. A method for driving a light source apparatus according to claim 1, wherein the mode selecting means has a polarization-mode dependency, and one of the oscillation light in the first mode and the oscillation light in the second mode is selected due to the polarization-mode dependency.

5. A method for driving a light source apparatus according to claim 1, wherein the oscillation wavelength in the first mode is always different from the oscillation wavelength in the second mode, and the mode selecting means comprises wavelength selecting means which can change a wavelength or a wavelength range to be selected thereby.

6. A method for driving a light source apparatus according to claim 1, wherein communication is performed by using the oscillation light in the mode selected by the mode selecting means, and the communication is continued by using the oscillation light in the selected mode even during a period in which the oscillation wavelength of the light in the unselected mode is changed to be set to the desired value.

7. A method for driving a light source apparatus according to claim 1, wherein said changing step is performed by a step in which when the light source is oscillated in the first mode by a first control amount applied thereto and oscillated in the second mode by a second control amount applied thereto, the control amount for oscillating the light source in the unselected mode is controlled to change the oscillation wavelength of the light in the unselected mode, while the control amount for oscillating the light source in the selected mode is controlled such that fluctuation of the oscillation wavelength of the light in the selected mode is being repressed.

8. A method for driving a light source apparatus according to claim 7, wherein the control of the control amount for oscillating the light source in the unselected mode is gradually performed in a plurality of divided steps.

9. A method for driving a light source apparatus according to claim 1, wherein the modulation signal for modulating the light source is inverted when the mode selecting means switches the mode to be selected.

10. A light source apparatus comprising:

a light source, an oscillation mode of said light source being switchable between a first mode under a first stimulated condition and a second mode under a second stimulated condition and an oscillation wavelength of said light source being changeable;

mode selecting means for selecting one of oscillation light in the first mode and oscillation light in the second mode emitted from said light source, said mode selecting means being able to change the mode to be selected between the first mode and the second mode;

light source control means for modulating the oscillation mode of said light source between the first mode and the second mode in accordance with a modulation signal and changing the oscillation wavelength of the light in the unselected mode to set this wavelength to a desired value, in response to an instruction from equipment connected to said light source apparatus, while repressing flucation of the oscillation wavelength of the light in the selected mode; and mode selection control means for controlling said mode selecting means to switch the mode to be selected by said mode selecting mans to the mode of the light whose oscillation wavelength has been set to the desired value by said light source control means.

11. A light source apparatus according to claim 10, wherein the light source comprises a laser device.

12. A light source apparatus according to claim 10, wherein the first mode and the second mode are respectively two linear polarization modes which are perpendicular to each other, and said mode selecting means comprises polarization selecting means which has a polarization-mode dependency and in which one of the oscillation light in the first mode and the oscillation light in the second mode is selected due to the polarization-mode dependency.

13. A light source apparatus according to claim 10, wherein the oscillation wavelength in the first mode is always different from the oscillation wavelength in the second mode, and said mode selecting means comprises wavelength selecting means which can change a wavelength or a wavelength range to be selected thereby.

14. A light source apparatus according to claim 10, wherein said light source control means is constructed such that when the light source is oscillated in the first mode by a first control amount applied thereto and oscillated in the second mode by a second control amount applied thereto, said light source control means can control the control amount for oscillating the light source in the unselected mode to change the oscillation wavelength of the light in the unselected mode, while controlling the control amount for oscillating the light source in the selected mode such that the fluctuation of the oscillation wavelength of the light in the selected mode is being repressed.

15. A light source apparatus according to claim 14, wherein said light source control means is constructed such that said light source control means can control the control amount for oscillating the light source in the unselected mode gradually in a plurality of divided steps.

16. A light source apparatus according to claim 10, wherein said light source control means inverts the modulation signal for modulating the light source when said mode selection control means controls said mode selecting means to switch the mode to be selected thereby.

17. An optical communication system for communicating over a light transmission medium that transmits signals from a transmitter side to a receiver side, said optical communication system comprising:

a) a transmitter including a light source apparatus, said light source apparatus including:

a light source, an oscillation mode of said light source being switchable between a first mode under a first stimulated condition and a second mode under a second stimulated condition and an oscillation wavelength of said light source being changeable;

mode selecting means for selecting one of oscillation light in the first mode and oscillation light in the second mode emitted from said light source, said mode selecting means being able to change the mode to be selected between the first mode and the second mode;

light source control means for modulating the oscillation mode of said light source between the first mode and the second mode in accordance with a modulation signal and changing the oscillation wavelength of the light in the unselected mode to set this wavelength to a desired value, in response to an instruction from equipment connected to said light source apparatus, while repressing fluctuation of the oscillation wavelength of the light in the selected mode; and       mode selection control means for controlling said mode selecting means to switch the mode to be selected by said mode selecting means to the mode of the light whose oscillation wavelength has been set to the desired value by said light source control means; and    b) a receiver for receiving the light transmitted from said transmitter.

18. An optical communication system according to claim 17, wherein said light source comprises a laser device.

19. An optical communication system according to claim 17, wherein the first mode and the second mode are respectively two linear polarization modes which are perpendicular to each other, and said mode selecting means comprises polarization selecting means which has a polarization-mode dependency and in which one of the oscillation light in the first mode and the oscillation light in the second mode is selected due to the polarization-mode dependency.

20. An optical communication system according to claim 17, wherein the oscillation wavelength in the first mode is always different from the oscillation wavelength in the second mode, and said mode selecting means comprises wavelength selecting means which can change a wavelength or a wavelength range to be selected thereby.

21. An optical communication system according to claim 17, wherein said light source control means is constructed such that when the light source is oscillated in the first mode by a first control amount applied thereto and oscillated in the second mode by a second control amount applied thereto, said light source control means can control the control amount for oscillating the light source in the unselected mode to change the oscillation wavelength of the light in the unselected mode, while controlling the control amount for oscillating the light source in the selected mode such that the fluctuation of the oscillation wavelength of the light in the selected mode is being repressed.

22. An optical communication system according to claim 21, wherein said light source control means is constructed such that said light source control means can control the control amount for oscillating the light source in the unselected mode gradually in a plurality of divided steps.

23. An optical communication system according to claim 17, wherein said light source control means inverts the modulation signal for modulating the light source when said mode selection control means controls said mode selecting means to switch the mode to be selected thereby.

\* \* \* \* \*

UNITED STATES PATENT AND TRADEMARK OFFICE
CERTIFICATE OF CORRECTION

PATENT NO. : 5,809,047

DATED : September 15, 1998

INVENTOR(S): JUN NITTA

It is certified that error appears in the above-identified patent and that said Letters Patent is hereby corrected as shown below:

COLUMN 1

Line 48, "I1" should read --$I_1$--.

COLUMN 8

Line 36, "Ifor" should read --$I_1$ for--.

COLUMN 12

Line 41, "mans" should read --means--.

Signed and Sealed this

First Day of June, 1999

Q. TODD DICKINSON

*Attest:*

*Attesting Officer*       Acting Commissioner of Patents and Trademarks